United States Patent
Kobayashi et al.

(10) Patent No.: US 6,914,325 B2
(45) Date of Patent: Jul. 5, 2005

(54) POWER SEMICONDUCTOR MODULE (75) Inventors: Takatoshi Kobayashi, Nagano (JP); Tadashi Miyasaka, Nagano (JP); Katsumi Yamada, Nagano (JP); Akira Morozumi, Nagano (JP)

(73) Assignee: Fuji Electric Co. Ltd., Kawasaki (JP)

( * ) Notice: Subject to any disclaimer, the term of this patent is extended or adjusted under 35 U.S.C. 154(b) by 0 days.

(21) Appl. No.: 10/621,547

(22) Filed: Jul. 18, 2003

(65) Prior Publication Data

US 2004/0017005 A1 Jan. 29, 2004

Related U.S. Application Data (62) Division of application No. 10/028,263, filed on Dec. 28, 2001, now Pat. No. 6,690,087.

(30) Foreign Application Priority Data

Dec. 28, 2000 (JP) ......................................... 2000-402127

(51) Int. Cl.⁷ ............................................. H01L 23/02
(52) U.S. Cl. .................. 257/686; 257/150; 257/177; 257/180; 257/182; 257/684; 257/685; 257/687; 257/703; 257/705; 257/706; 257/712; 257/713; 257/717; 257/750; 257/758; 257/762; 257/765; 257/772
(58) Field of Search ......................... 257/150, 177, 257/180, 182, 684–687, 703, 705, 706, 712, 713, 717, 750, 758, 762, 765, 772

(56) References Cited

U.S. PATENT DOCUMENTS

| | | | | |
|---|---|---|---|---|
| 4,766,481 A | * | 8/1988 | Gobrecht et al. | 257/664 |
| 4,788,626 A | * | 11/1988 | Neidig et al. | 361/715 |
| 5,291,065 A | * | 3/1994 | Arai et al. | 257/723 |
| 5,699,232 A | * | 12/1997 | Neidig et al. | 361/752 |
| 5,753,971 A | * | 5/1998 | Miller et al. | 257/690 |
| 5,793,106 A | * | 8/1998 | Yasukawa et al. | 257/712 |
| 5,920,119 A | * | 7/1999 | Tamba et al. | 257/718 |
| 5,928,768 A | | 7/1999 | Ikeda et al. | 428/210 |
| 5,942,797 A | * | 8/1999 | Terasawa | 257/723 |
| 6,066,219 A | | 5/2000 | Schulz-Harder et al. | 156/89.11 |
| 6,215,185 B1 | * | 4/2001 | Kikuchi et al. | 257/747 |
| 6,261,703 B1 | | 7/2001 | Sasaki et al. | 428/627 |
| 6,309,737 B1 | | 10/2001 | Hirashima et al. | 428/210 |
| 6,396,125 B1 | * | 5/2002 | Soyano | 257/565 |
| 2002/0153532 A1 | * | 10/2002 | Sonobe et al. | 257/150 |

FOREIGN PATENT DOCUMENTS

JP  11-233671  8/1999

* cited by examiner

Primary Examiner—Amir Zarabian
Assistant Examiner—Ida M. Soward
(74) Attorney, Agent, or Firm—Staas & Halsey LLP (57) ABSTRACT A power semiconductor module has a circuit assembly body, which includes a metal base, a ceramic substrate, and a power semiconductor chip, and is combined with a package having terminals formed integrally. The ceramic substrate of the module has a structure such that an upper circuit plate and a lower plate are joined to both sides of a ceramic plate, respectively, and the metal base and the ceramic substrate are fixed to one another using solder, thereby improving reliability and lengthening a life of a power semiconductor module by optimizing a ceramic substrate and a metal base thereof, the dimensions thereof, and material and method used for a join formed between the ceramic substrate and metal base.

4 Claims, 7 Drawing Sheets

PRIOR ART

POWER SEMICONDUCTOR MODULE

CROSS-REFERENCE TO RELATED APPLICATIONS

This application is a divisional of application Ser. No. 10/028,263, filed Dec. 28, 2001, now U.S. Pat. No. 6,690,087.

This application is based upon and claims the priority of Japanese application no. 2000-402127, filed Dec. 28, 2000, and U.S. patent application Ser. No. 10/028,263, filed Dec. 28, 2001, the contents being incorporated herein by reference.

BACKGROUND OF THE INVENTION

1. Field of the Invention

The present invention relates to a power semiconductor module that may be applied to a converter or inverter of a power switching device, for example.

2. Description of the Related Art

First, the assembled structure of a conventional example of such a power semiconductor module (in which six elements form a structure for three circuits), will now be described using FIGS. 9a and 9b. In the figures, a metal base (copper base plate) 1 is provided for radiating heat, which is a heat sink, an outer case 2 is provided having terminals formed integrally, and a main circuit terminal 3 is provided in this outer enclosing case 2. A control terminal 4, a power circuit block 5, a control circuit block 6, and bonding wires 7 including internal wiring are also provided.

Figure 9A:
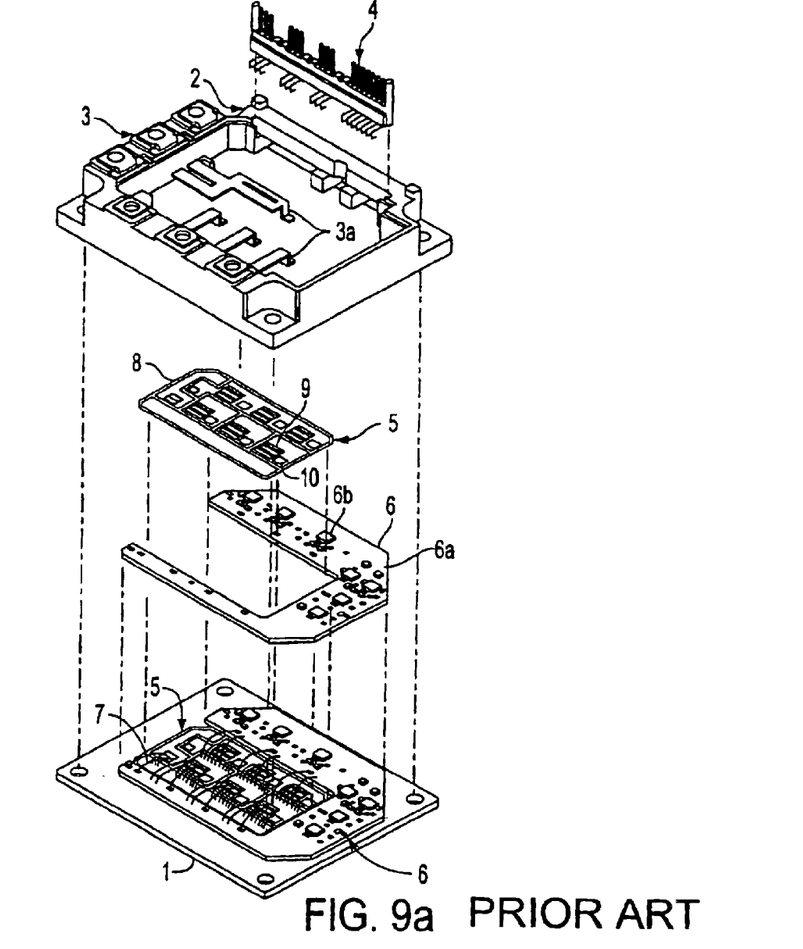
FIG. 9a is a figure showing an exploded view of a conventional power semiconductor module.
Figure 9B:
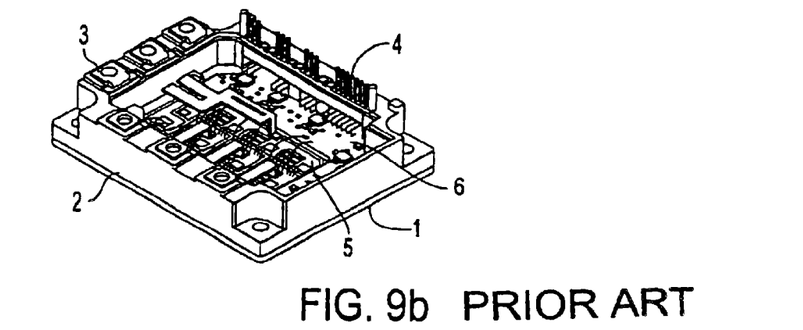
FIG. 9b is a perspective view of an outside of the conventional power semiconductor module of FIG. 9a in an assembled condition.

FIGS. 9a and 9b illustrate the power circuit block 5 having six of each of a power semiconductor chip 9, such as an IGBT, and a free-wheeling diode 10, mounted on a ceramic substrate 8 that is in the shape of a rectangular oblong. Further, as shown by the schematic view of FIG. 4, the ceramic substrate 8 is a direct copper bonding substrate including an upper circuit plate 8b, and a lower plate 8c, which are plated with copper foil and are directly joined to the upper surface and lower surface, respectively, of a ceramic plate 8a made from alumina, aluminum nitride or silicon nitride. A semiconductor pattern is formed on the upper circuit plate 8b. The semiconductor chips 9 are mounted on the upper circuit plate 8b via a solder join layer 11 including solder. Referring to FIGS. 9a and 9b, the control circuit 6 is made such that drive ICs 6b, which are for driving power circuit elements, and circuit components associated with these drive ICs, are mounted on a U-shaped printed substrate 6a surrounding the power circuit block 5.

In addition, the power circuit block 5 and the control circuit block 6 are placed side by side on a metal base 1. Thereupon, the lower plate 8c of the ceramic substrate 8, on the power circuit block 5, and the metal base 1 are joined using Sn—Pb solder (this solder is represented by "12") to conduct heat generated by the power semiconductor chips 9 to the metal base 1 via the ceramic substrate 8. Further, the printed substrate 6a of the control circuit block 6 is affixed to the metal base 1 using an adhesive.

The outer case 2 having terminals integrally formed therein is joined to the metal base 1 using an adhesive. Specifically, the outer case 2 is placed over the power circuit block 5 and the control circuit block 6 is mounted on the metal base 1 so as to enclose the power circuit block 5 and the control circuit block 6. The inner lead portions 3a of the main circuit terminals 3 are soldered to the printed pattern of the ceramic substrate 8, and control terminals 4 become internal wiring as a result of bonding wires 7 to the printed pattern of the printed substrate 6. Further, after a gel-like filler material (silicon gel, for example), has been injected into the outer enclosing case 2 to seal off each of the circuit blocks using resin, the outer enclosing case is covered with a lid (not shown) to thus complete the power semiconductor module.

Power semiconductor modules like those mentioned above are extensively employed in various fields, from low-capacity devices for everyday use to high-capacity devices which are used industrially or in vehicles, for example. In such cases, low-capacity modules for everyday-use, for which the degree of reliability required is not particularly high, and in which the amount of heat generated by power semiconductor elements is limited, can be designed and manufactured with barely any restrictions being placed on the material and size of each of the components. On the other hand, where high-capacity modules are concerned, which are typically used in power circuits of vehicle drive devices, there is sometimes an increased amount of heat generated per unit area of power chips in the high-capacity modules. Because the size of such power chips is smaller and more compact, there is a demand for high reliability and long life in high-capacity modules compared to the low-capacity modules in products manufactured for everyday use.

For example, a heat cycle test to which manufactured power modules are subjected to include conditions for one heat cycle: −40° C. (60 minutes), followed by room temperature (30 minutes), followed by 125° C. (60 minutes), and followed by room temperature (30 minutes). In contrast, ordinary general-purpose products are subjected to a test of around 100 cycles. Accordingly, the reliability required for products manufactured for vehicle drive devices is such that such products must sufficiently withstand a heat cycle test of 3000 cycles.

Satisfying these requirements of high reliability and long life naturally means improving the reliability of the power semiconductor chips themselves. In addition, a pressing problem regarding these power semiconductor chips includes ensuring a durability that can sufficiently withstand high levels of heat radiation, and the severe heat cycles accompanying the motion of the vehicle, at the same time as ensuring the required electrical insulation resistance.

Figure 4:
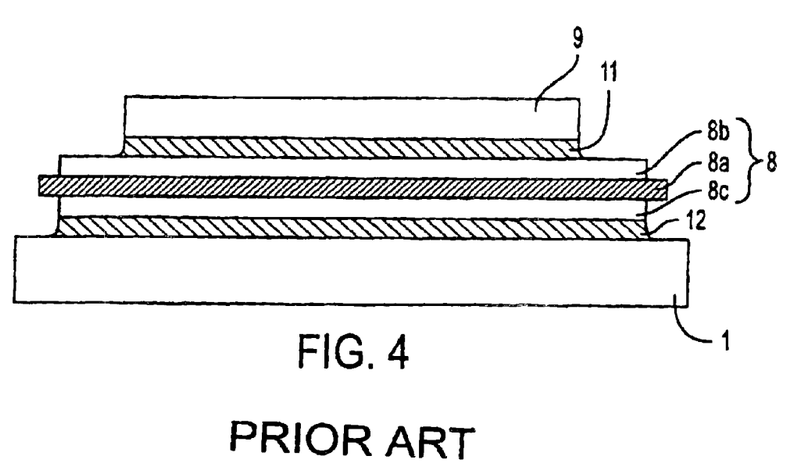
FIG. 4 is a figure showing a conventional power semiconductor module having an assembly body including a metal base/a ceramic substrate/a power semiconductor chip.

In a structure in which a ceramic substrate 8 mounted on a metal base 1 is joined thereto with solder, as shown in FIG. 4, the problems set forth above are accompanied by the problems noted hereinbelow.

(1) Thermal stress attributable to a difference in the thermal expansion of the ceramic substrate/metal base: specifically, while a rate of thermal expansion of the ceramic substrate is 7 ppm/K for alumina, 4.5 ppm/K for aluminum nitride, and 3 ppm/K for silicon nitride, a rate of thermal expansion of the metal base (copper base) is 16.5 ppm/K, which provides for a large difference between the thermal expansion rates of the ceramic substrate and the metal base. Meanwhile, the yield strength of the solder (Sn—Pb solder), which forms the join between the metal base and the ceramic substrate, is low at around 35 to 40 MPa, and, when the stress at the solder join portion repeatedly increases with successive heat cycles on account of the difference between the thermal expansion rates of the metal base and the ceramic substrate, this solder eventually burns out.

In addition, with regard to a life of the solder until burn-out, after performing various testing on the life of the solder in addition to a corresponding analysis, it has been established that there was a tendency for the life of the solder to be heavily dependent on the conditions below. In other words, assuming that the ceramic material of the ceramic substrate soldered onto the metal base is the same: (a) an increase in the plate thickness of the ceramic substrate entails an increase in the strain generated in the solder join portion, and the life before burn-out becomes short (dependence on the thickness of the substrate); (b) an increase in the surface area of the ceramic substrate entails an increase in the strain generated in the solder join portion, and the life before burn-out becomes short (dependence on the surface area of the substrate); (c) an increase in the ratio of the length and breadth of the ceramic substrate entails an increase in the strain generated in the solder join portion, and the life before burn-out becomes short (dependence on the shape of the substrate); and (d) a decrease in the thickness of the solder constituting the solder join layer entails an increase in the strain generated, and the life before burn-out becomes short (dependence on the thickness of the solder).

(2) Thermal conductivity between the ceramic substrate/metal base: The heat generated by the power semiconductor chip is thermally conducted via the ceramic substrate to the metal base, which functions as a heat sink, and is radiated from the metal base to the outside. Consequently, it is necessary to keep the resistance to thermal conduction as low as possible between the ceramic substrate and the metal base.

Accordingly, (a) while a thermal conduction rate of the ceramic substrate is 20 W/mK for alumina, 180 to 200 W/mK for aluminum nitride, 70 to 100 W/mK for silicon nitride, and the thermal conduction rate of the copper base is 398 W/mK, the thermal conduction rate of the solder (Sn—Pb solder), which forms a join between the metal base and the ceramic substrate, is 40 to 50 W/mK. As a result, a thermal resistance of the solder join portion has a major influence on the thermal conduction in the thermal conduction path between the power semiconductor chip and the metal base. (b) Further, upon soldering the ceramic substrate onto the metal base, when voids (air bubbles) are generated in the solder join layer, these voids provide for a thermal resistance and therefore obstruct the radiation of heat. Consequently, an increase in the thickness of the solder layer of the solder join layer entails lower heat radiation, which has an adverse effect on the reliability and durability of the module.

SUMMARY OF THE INVENTION

It is therefore an object of the present invention to provide a power semiconductor module in which the material of the ceramic substrate and the metal base, the dimensions thereof, the material for joining the ceramic substrate and the metal base, and the joining method, are optimized on the basis of an analysis of the results of each of the above-mentioned tests, and in which module the thermal strain, which is generated between the ceramic substrate and the metal base with successive heat cycles, is alleviated and thermal conductivity is improved, thus it becomes possible to ensure the high degree of reliability and long life that are required for use in vehicles.

The present invention provides a power semiconductor module, including: a metal base including a heat sink; a circuit assembly body including an upper circuit plate, a lower plate, a ceramic plate including an upper surface and a lower surface; a ceramic substrate placed on the metal base including the upper circuit plate and the lower plate, wherein the upper circuit plate and the lower plate are joined to the upper surface and lower surface of the ceramic plate, respectively, and a semiconductor chip, wherein the semiconductor chip is placed on the ceramic substrate; an outer case including terminals formed integrally therein; a join formed between the metal base and the lower plate of the ceramic substrate; and a power semiconductor module assembled by forming a join using solder between the metal base and the ceramic substrate.

The solder includes a melting point of 183 to 250° C. and the thickness of the solder layer is at least 0.1 mm and no more than 0.3 mm. The upper circuit plate and the lower plate are made of metal. The metal base includes copper or a copper alloy with a thermal conduction rate of at least 250 W/mK. A plate thickness of the metal base includes between about 3.9 mm to 6 mm. A thickness of the ceramic plate of the ceramic substrate includes between about 0.1 mm to 0.65 mm, a thickness of the upper circuit plate and of the lower plate includes between about 0.1 mm to 0.5 mm, an overall size of the ceramic substrate includes 50 mm×50 mm, and a ratio of a length and a breadth of the ceramic substrate including 1:1 to 1:1.2.

The ceramic plate of the ceramic substrate is aluminum nitride, and the upper circuit plate and the lower plate are aluminum. The ceramic plate of the ceramic substrate is silicon nitride, and the upper circuit plate and the lower plate are copper. The power semiconductor module comprises the ceramic plate of the ceramic substrate is alumina, and the upper circuit plate and the lower plate are copper and placing at least one ceramic substrate on the metal base.

The present invention is also achieved by a power semiconductor module, including: a metal base including a heat sink; a semiconductor chip; a ceramic substrate; a circuit assembly body including the ceramic substrate, wherein the semiconductor chip is placed on the ceramic substrate which is then placed on the metal base; and an outer case having terminals formed integrally therein, wherein the ceramic substrate is integrally formed on the metal base by successively spray-forming a ceramic layer of the ceramic substrate, and a copper layer of the upper circuit plate, on the surface of the metal base. The ceramic layer is any one of alumina, aluminum nitride, and silicon nitride. Aluminum is spray-formed on the surface of the copper layer to form an upper circuit plate bonding pad.

The present invention is also achieved by a power semiconductor module, including: a metal base including a heat sink; a semiconductor chip; a ceramic substrate; a circuit assembly body including a ceramic plate, an upper circuit plate, and the ceramic substrate, wherein the semiconductor chip is placed on the ceramic substrate which is then placed on the metal base; and an outer case having terminals formed integrally therein, wherein a casting method integrally molds the metal base on the underside of the ceramic plate of the ceramic substrate, which has no lower plate and in which the upper circuit plate is joined to the ceramic plate.

The present invention also provides a power semiconductor module, including: a metal base including a heat sink; a semiconductor chip; a ceramic substrate; a circuit assembly body including the ceramic substrate, wherein the semiconductor chip is placed on the ceramic substrate which is then placed on the metal base; and an outer case having terminals formed integrally therein, wherein an upper circuit plate and the metal base are formed directly by a formation of a layer of molten metal on an upper face and a lower face of the ceramic plate, respectively.

The present invention also provides a power semiconductor module, including: a metal base including a heat sink; a semiconductor chip; a ceramic substrate; a circuit assembly body including a circuit assembly body including an upper circuit plate, a ceramic plate, and the ceramic substrate, wherein the semiconductor chip is placed on the ceramic substrate which is then placed on the metal base; and an outer case having terminals formed integrally therein, wherein the ceramic substrate has no lower plate and in the ceramic substrate, a silver wax material brazes the upper circuit plate joined to the ceramic plate and the metal base.

These together with other objects and advantages, which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

The above objective and advantage of the present invention will become more apparent by describing in detail preferred embodiments thereof with reference to the attached drawings in which:

FIG. 1b is a schematic view showing a planar view of the assembly body of FIG. 1a;

DETAILED DESCRIPTION OF THE PREFERRED EMBODIMENTS

Reference will be now made in detail to the present exemplary embodiments of the present invention, examples of which are illustrated in the accompanying drawings. Further, a description has been omitted for members corresponding to FIGS. 4 through 9 and to which the same reference numerals have been assigned in each of the embodiments.

First Embodiment

Figure 1A:
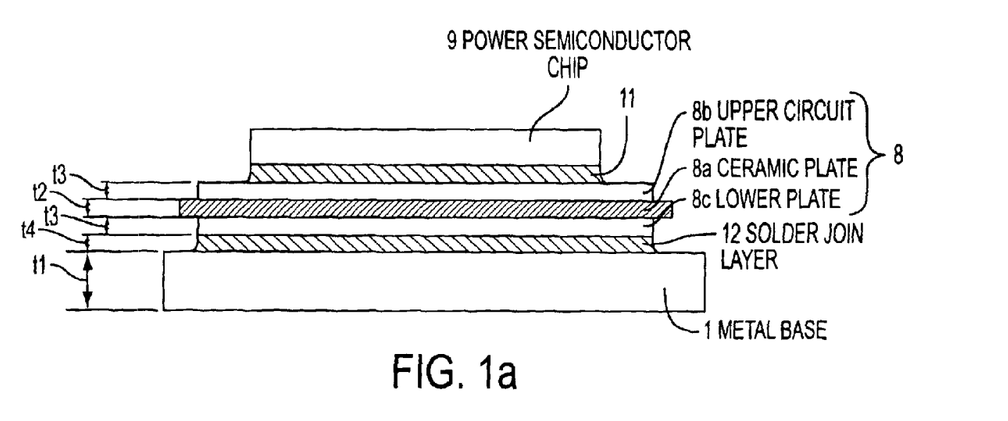
FIG. 1a is a schematic side view showing an assembly body including a metal base/a ceramic substrate/a power semiconductor chip, relating to a first embodiment of the present invention.
Figure 1B:
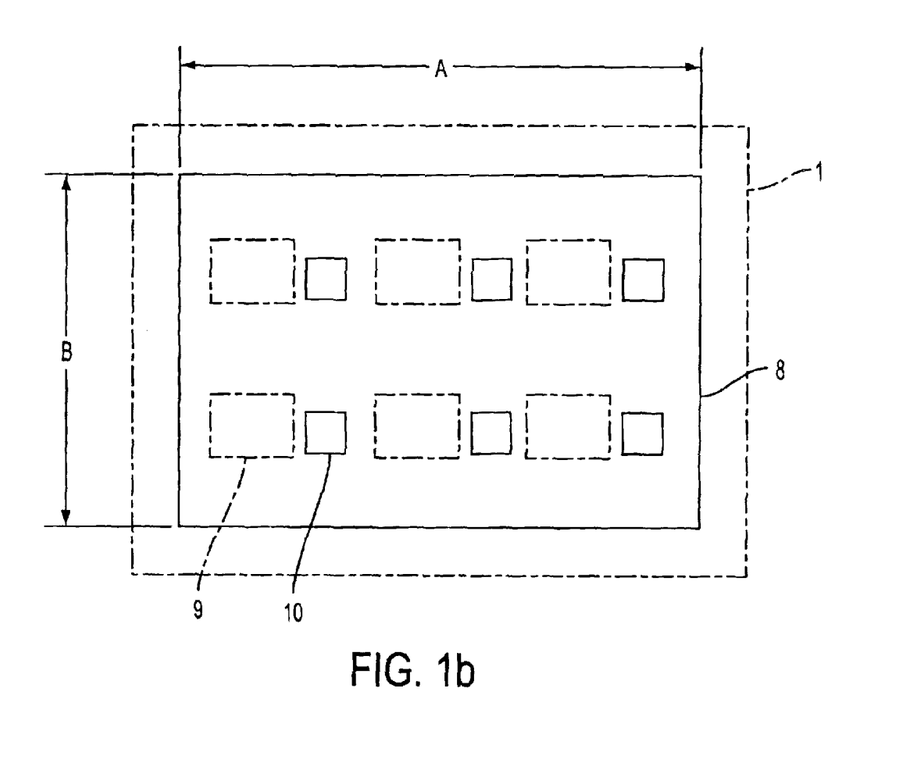

FIG. 1a is a schematic side view showing an assembly body including a metal base/a ceramic substrate/a power semiconductor chip, relating to a first embodiment of the present invention. FIG. 1b is a schematic view showing a planar view of the assembly body of FIG. 1a. A structure of a ceramic substrate 8 is such that an upper circuit plate 8b and a lower plate 8c are joined to the upper surface and lower surface of a ceramic plate 8a, respectively; and a join is formed using solder between the metal base 1 and the lower plate 8c of the ceramic substrate 8.

Here, the material of the metal base 1 is copper or a copper alloy, which has a thermal conduction rate equal to or greater than 250 W/mK. A plate thickness t1 of this metal base is 3.9 mm to 6 mm. A thickness t2 of the ceramic plate 8a of the ceramic substrate 8 is 0.1 mm to 0.65 mm, and the thickness of the upper circuit plate 8b and of the lower plate 8c is 0.1 mm to 0.5 mm. An overall size (a×b) of the ceramic substrate 8 is set to be at most 50 mm×50 mm, and the ratio of the length and breadth thereof is set within a range of 1:1 to 1:1.2. Further, the metal base 1 and the ceramic substrate 8 are assembled by forming a join therebetween using solder, where the solder employed is Sn—Pb solder having a melting point of 183 to 250° C. and the thickness of the solder join layer 12 is 0.1 to 0.3 mm.

Further, combining materials such as those detailed hereinafter may include the ceramic substrate 8. Specifically, (1) the material of the ceramic plate 8a may be aluminum nitride, and the material of the upper circuit plate 8b and the lower plate 8c, which are joined to the upper side and the lower side of the ceramic plate 8a, may be aluminum; (2) the material of the ceramic plate 8a may be silicon nitride, and the material of the upper circuit plate 8b and the lower plate 8c may be copper; and (3) the material of the ceramic plate 8a may be alumina, and the material of the upper circuit plate 8b and the lower plate 8c may be copper.

Figure 5A:
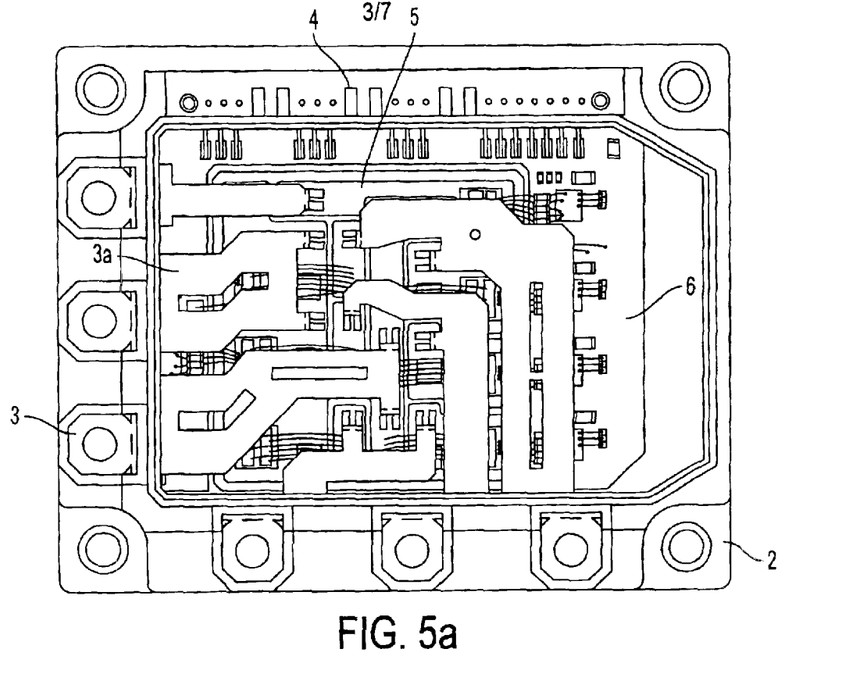
FIG. 5a is a figure showing a planar view of a manufactured power semiconductor module having one ceramic substrate, according to the present invention.
Figure 5B:
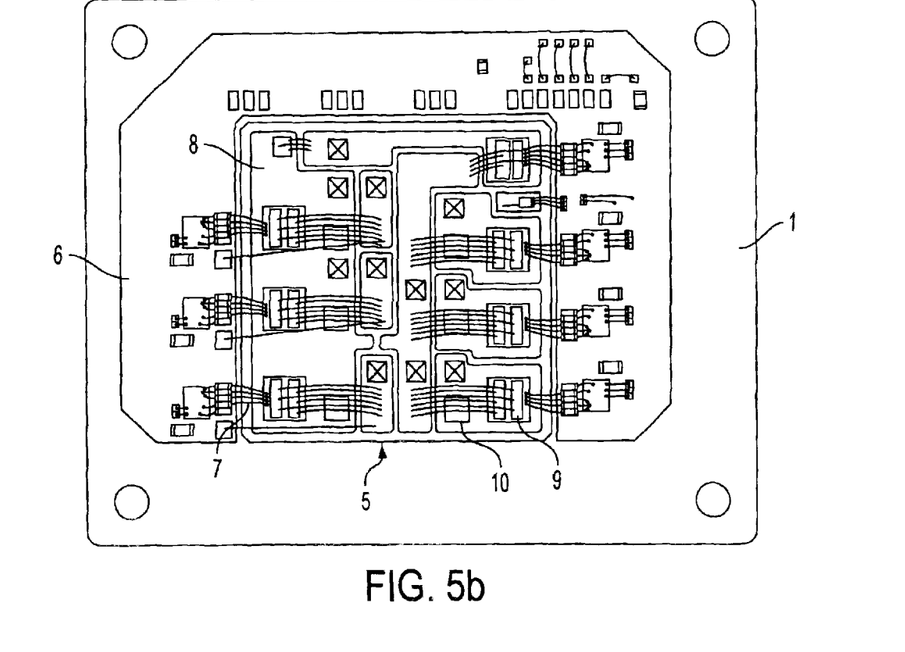
FIG. 5b is a figure showing a planar view of the manufactured power semiconductor module having one ceramic substrate with an outer enclosing case removed, according to the present invention.
Figure 6A:
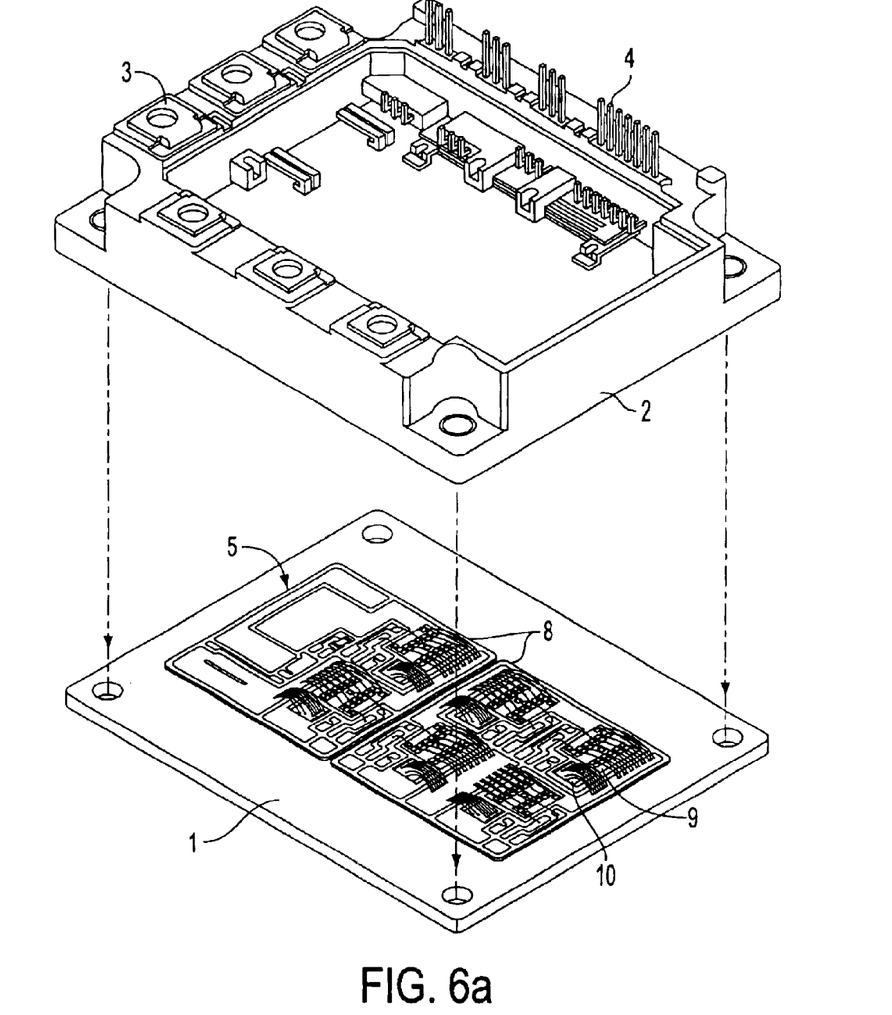
FIG. 6a is a figure showing an exploded perspective of a manufactured power semiconductor module having two ceramic substrates, according to the present invention.
Figure 6B:
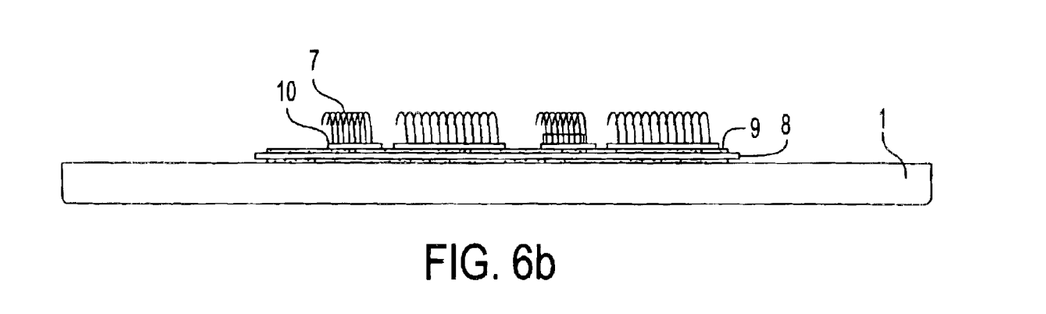
FIG. 6b is a figure showing a side view of the manufactured power semiconductor module having two ceramic substrates with the outer enclosing case removed, according to the present invention.
Figure 7A:
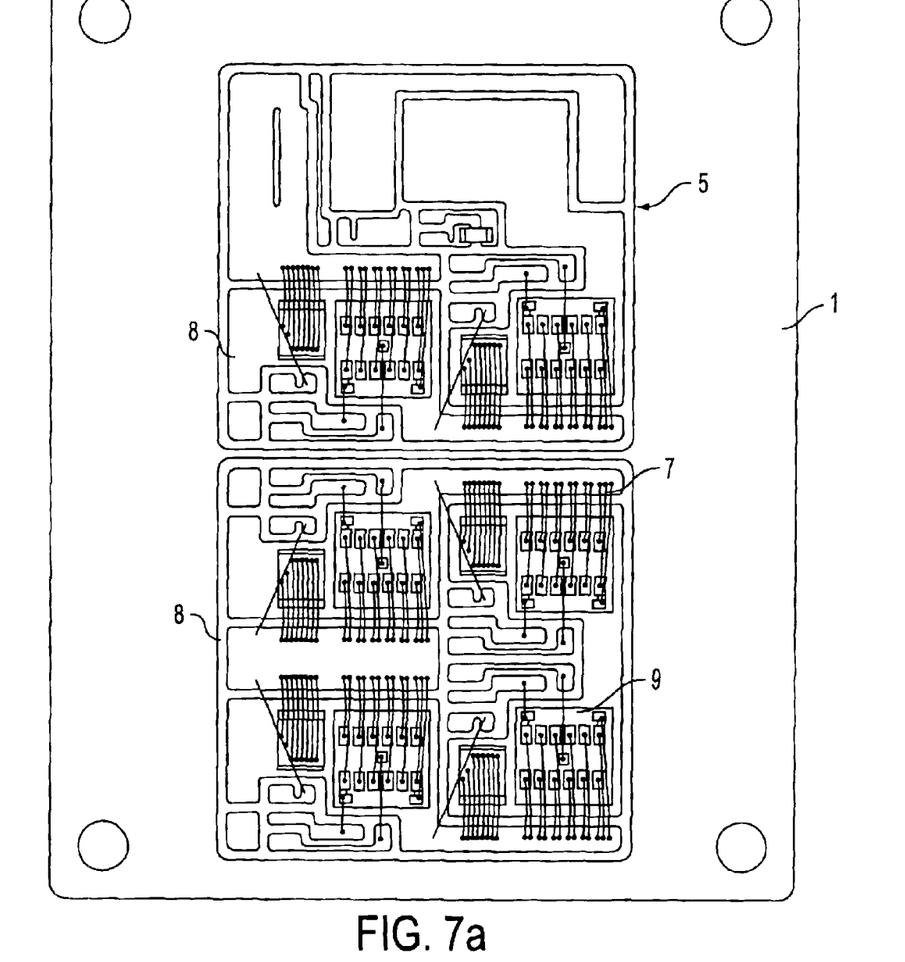
FIG. 7a is a figure showing a planar view of a circuit assembly body in the power semiconductor module of FIG. 6.
Figure 7B:
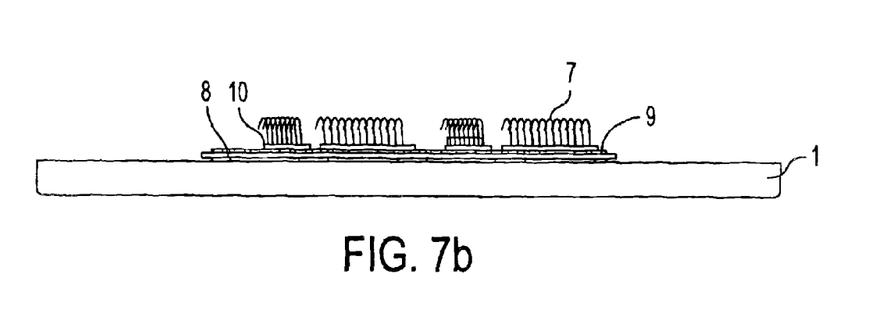
FIG. 7b is a figure showing a side view of a circuit assembly body in the power semiconductor module of FIG. 6.

Furthermore, a power semiconductor module, as exemplified in FIGS. 5a through 8b, includes: the material of the metal base 1 and the ceramic substrate 8, the size thereof, and the material and thickness of the solder, as described above. By way of example, FIG. 5a and FIG. 5b show examples of manufactured products in which a power circuit block 5 is includes one ceramic substrate 8 mounted on a metal base 1, where the metal base 1 is made from a copper alloy and has a plate thickness of 4 mm, and an overall size of length 86 mm and breadth 107 mm. Further, the ceramic plate 8a of the ceramic substrate 8 is an alumina plate with a plate thickness of 0.32 mm, and an overall size of length 51 mm and breadth 50 mm, where the length to breadth ratio is 1:1.02. A join is formed using Sn—Pb solder between the metal base 1 and the ceramic substrate 8, where a thickness of the solder join layer is 0.15 mm.

In addition, in the example of a manufactured product shown in FIGS. 6a and 6b, and FIGS. 7a and 7b, the power circuit block 5 is divided into two ceramic substrates 8, which are placed side by side on the metal base 1, where the metal base 1 is made from a copper alloy having a plate thickness of 4 mm and an overall size of length 68 mm and breadth 98 mm. In turn, ceramic plates of the ceramic substrates 8 may be alumina plates with a thickness of 0.25 mm, and an overall size of a ceramic plate of the ceramic substrate 8 positioned on a left of the power circuit block 5 may include: a length of 38 mm and a width of 33 mm. An overall size of a ceramic plate of ceramic substrate 8 positioned on a left of the power circuit block 5 may include: a length of 38 mm, a width of 39 mm, where a length to breadth ratio of the left and right plates may be 1:1.15 and 1:1.02, respectively. Further, a join is formed using Sn—Pb solder between the metal base 1 and each of the ceramic substrates 8, respectively, positioned on the left and right of the power circuit block 5, where the thickness of the solder join layer may be 0.15 mm.

Figure 8A:
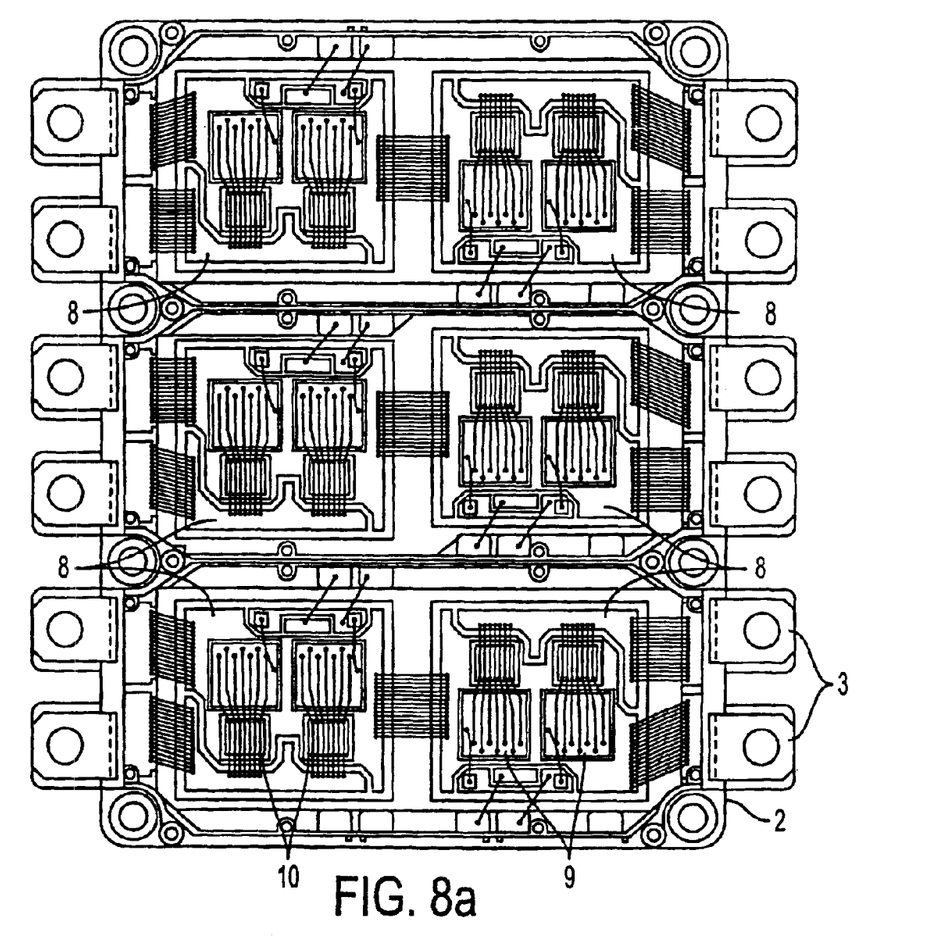
FIG. 8a is a figure showing a planar view of a manufactured power semiconductor module having six ceramic substrates, according to the present invention.
Figure 8B:
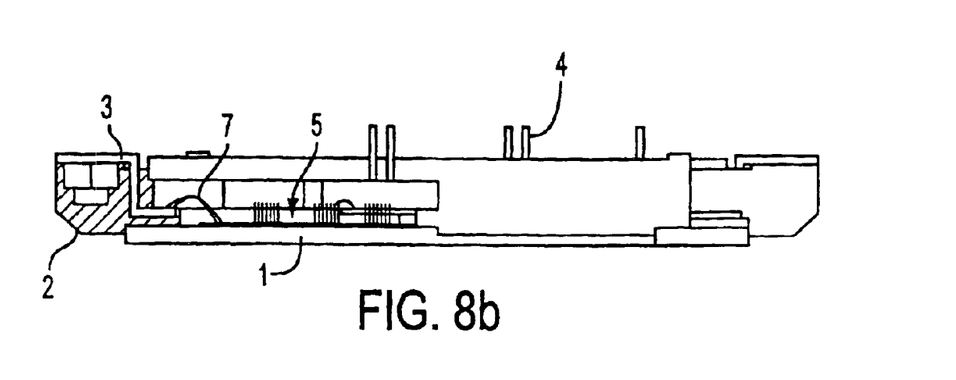
FIG. 8b is a figure showing a cross-sectional view seen from a side of a manufactured power semiconductor module having six ceramic substrates, according to the present invention.

Further, in the example of a manufactured product shown in FIGS. 8a and 8b, the power circuit block 5 is divided into six ceramic substrates 8, which are placed side by side on the metal base 1, where the metal base 1 may be made from a copper alloy with a plate thickness of 4 mm, and with an overall size of length 122 mm and breadth 162 mm. Further, a ceramic plate of each of these ceramic substrates 8 is an alumina plate with a thickness of 0.32 mm, and with an overall size of length 38 mm, and width 41.9 mm, where the length to breadth ratio of these plates is 1:1.1. A join is formed using Sn—Pb solders between the metal base 1 and each of the ceramic substrates 8, where the thickness of the solder join layer is 0.15 mm.

Second Embodiment

Figure 2:
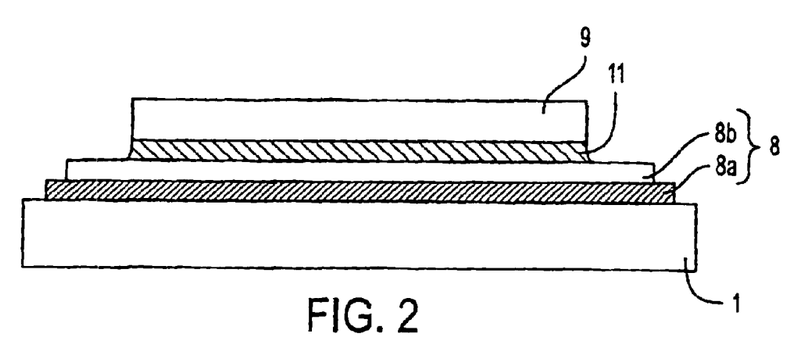
FIG. 2 is a figure showing an assembly body including a metal base/a ceramic substrate/a power semiconductor chip, according to a second and a third embodiment of the present invention.

A second embodiment of the present invention will be described hereinbelow referring to FIG. 2. In this embodiment, without using solder in a formation of a join between the metal base 1 and the ceramic substrate 8, the ceramic substrate 8 is integrally molded directly onto the metal base 1 using the method described below.

Specifically, by spray-forming a ceramic material such as alumina, aluminum nitride or silicon nitride onto the surface of the metal base 1 (one face thereof) by means of a plasma spray-forming method, a ceramic layer, which corresponds to the ceramic plate 8a and having thickness of 0.1 to 0.65 mm, is formed covering and adhering to the surface of the metal base 1. Next, copper is spray-formed, using the plasma spray-forming method, on this ceramic layer, where a copper layer, which corresponds to the upper circuit plate 8b and has a thickness of 0.1 to 0.5 mm, is formed as a lamination layer thereon. Further, copper, aluminum or molybdenum, or a combination of these materials, may be employed for the metal base 1.

Further, the above-mentioned ceramic layer and copper layer, which are formed on the metal base using the plasma spray-forming method, correspond to the ceramic plate 8a of the ceramic substrate 8, and the upper circuit plate 8b, respectively. A power semiconductor chip 9, for example, is mounted using solder on this upper circuit plate 8b. It is also possible to form a bonding pad by spray-forming an alumina layer on the copper layer.

By means of such a constitution, since there is no solder layer interposed between the metal base 1 and the ceramic substrate 8, thermal resistance is diminished by an amount representing this solder or the like, and the heat radiation is thereby improved. In addition, since no solder join is employed, the soldering process and the solder material are omitted, and the problems of an increase in the thermal resistance attributable to voids in the solder layer, and of the solder join layer burning out as a result of thermal strain therein, are also resolved.

The ceramic layer, which is spray-formed on the metal base 1, is not restricted to one particular kind of ceramic material. Alumina, for example, may be spray-formed on the metal base 1, and, subsequently, aluminum nitride, silicon nitride or another insulating material may be spray-formed on the resulting laminated metal base 1 to form lamination layers.

Third Embodiment

Next, a third embodiment of the present invention, will be described through reference to FIG. 2. In this embodiment, a ceramic substrate 8, which has no lower plate and in which an upper circuit plate 8b is made using copper foil or the like, is joined to the surface of a ceramic plate 8a, and has a metal base 1 integrally molded with the underside of the ceramic plate 8a using a casting method. The metal base 1 is made from aluminum (melting point: 500 to 700° C.), which has a lower melting point than copper (melting point: 1085° C.).

In this casting method, the underside of the ceramic plate 8a of the ceramic substrate 8 is set in a mold. The mold is full of molten metal that is to be the material of the metal base, such that the underside of this ceramic plate is soaked with this molten metal, and the metal base 1 is cast in these conditions alone. A metal base 1 is thus formed that is integrally connected to the ceramic substrate 8.

In this embodiment, similarly to the second embodiment described above, because no solder layer is interposed between the metal base 1 and the ceramic substrate 8, the problems of an increase in the thermal resistance, and of the solder join layer burning out as a result of thermal strain therein, are also resolved.

As an applied example of this embodiment in which a casting method is employed, it is possible to use molten metal to integrally form an upper circuit plate 8b and a metal base 1 on the upper face and lower face of the ceramic plate 8a, respectively.

Fourth Embodiment

Figure 3:
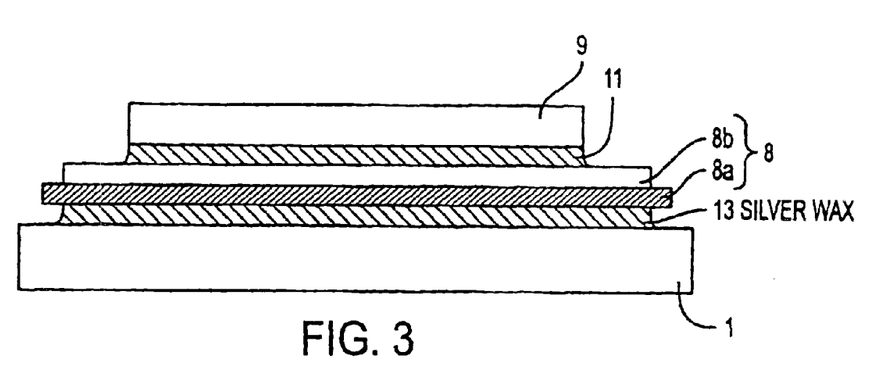
FIG. 3 is a figure showing an assembly body including a metal base/a ceramic substrate/a power semiconductor chip, according to a fourth embodiment of the present invention.

Next, a fourth embodiment of the present invention, will be described using FIG. 3. In this embodiment, a metal base 1 and a ceramic substrate 8, which has no lower plate and in which an upper circuit plate 8b has already been joined to a ceramic plate 8a, are combined using silver wax 13. This fixing operation using wax involves inserting silver wax in the form of a sheet or a cream between the metal base 1 and the ceramic plate 8a of the ceramic substrate 8, and then introducing the resulting assembly into a reflow furnace to cause this fixing using wax.

In this constitution, the thermal conduction rate of the silver wax material is equal to or greater than 300 W/mK, which is at least six times higher than the thermal conduction rate of 40 to 50 W/mK of Sn—Pb solder. Therefore, in addition to being able to obtain a high degree of heat dissipation in comparison with the conventional structure shown in FIG. 4, a yield strength is high in comparison with that of solder, and reliability with respect to burn-out is also improved. Moreover, similarly to the first embodiment, the second through fourth embodiments described above may be applied to each of the different types of manufactured power semiconductor module shown in FIGS. 5 through 8.

As described above, the following effects are afforded by the present invention:

(1) The following are optimally set: the material of the ceramic substrate, which has a power semiconductor chip mounted thereon, and of the metal base for radiating heat, which is a heat sink; the dimensions thereof; the solder material, which joins the ceramic substrate and the metal base; and the thickness of the solder layer. Such a constitution makes it possible to obtain a high degree of heat radiation and to reduce thermal strain, which is generated between the ceramic substrate/metal base with successive heat cycles during electrification of the power semiconductor module. Further, the constitution ensures the required insulation resistance. It is thus possible to obtain a power semiconductor module that satisfies the conditions of high reliability and durability that are required for use, for example, in vehicles.

(2) Further, in the embodiments in which no solder is employed in the joining together of the metal base and the ceramic substrate, and the lower plate of the ceramic substrate is omitted such that a direct join is made with the metal base, because there is nothing interposed between the metal base and the ceramic substrate, such as solder, the thermal resistance is reduced by an amount representing this solder or the like, and the heat radiation is thereby improved. In addition, because no solder join is employed, the soldering process and the solder material are omitted. Accordingly, the problems of an increase in the thermal resistance attributable to voids in the solder layer and of the solder join layer burning out as a result of thermal strain therein are also resolved.

(3) Moreover, in the embodiments in which a metal base and a ceramic substrate are fixed together using silver wax material, it is possible to afford the module excellent heat radiation in comparison with a module which is joined together using solder, as well as high durability with respect to burn-out.

What is claimed is:

1. A power semiconductor module, comprising:
   a metal base comprising a heat sink;
   a semiconductor chip;
   a ceramic substrate;
   a circuit assembly body comprising a ceramic plate, an upper circuit plate, and the ceramic substrate, wherein the semiconductor chip is placed on the ceramic substrate which is then placed on the metal base; and
   an outer case joined to the metal base and having terminals formed integrally therein,
   wherein a casting method integrally molds the metal base on the underside of the ceramic plate of the ceramic substrate, which has no lower plate and in which the upper circuit plate is joined to the ceramic plate.

2. The power semiconductor module according to claim 1, wherein the power semiconductor module comprises placing at least one ceramic substrate on the metal base.

3. A power semiconductor module, comprising:
   a metal base comprising a heat sink;
   a semiconductor chip;
   a ceramic substrate;
   a circuit assembly body comprising the ceramic substrate, wherein the semiconductor chip is placed on the ceramic substrate which is then placed on the metal base; and
   an outer case having terminals formed integrally therein,
   wherein an upper circuit plate and the metal base are formed directly by a formation of a layer of molten metal on an upper face and a lower face of the ceramic plate, respectively.

4. A method of forming a power semiconductor module, comprising:
   placing a semiconductor chip on a ceramic substrate;
   placing the ceramic substrate on a metal base comprising a heat sink; and
   forming a layer of molten metal on an upper face and a lower face of the ceramic substrate to directly form an upper circuit plate and the metal base.

* * * * *